United States Patent
Brauer et al.

(10) Patent No.: US 11,010,885 B2
(45) Date of Patent: May 18, 2021

(54) OPTICAL-MODE SELECTION FOR MULTI-MODE SEMICONDUCTOR INSPECTION

(71) Applicant: KLA-Tencor Corporation, Milpitas, CA (US)

(72) Inventors: Bjorn Brauer, Beaverton, OR (US); Richard Wallingford, Forsyth, MO (US); Kedar Grama, Fremont, CA (US); Hucheng Lee, Cupertino, CA (US); Sangbong Park, Union City, CA (US)

(73) Assignee: KLA Corporation, Milpitas, CA (US)

( * ) Notice: Subject to any disclaimer, the term of this patent is extended or adjusted under 35 U.S.C. 154(b) by 34 days.

(21) Appl. No.: 16/406,374

(22) Filed: May 8, 2019

(65) Prior Publication Data
US 2020/0193588 A1    Jun. 18, 2020

Related U.S. Application Data

(60) Provisional application No. 62/781,593, filed on Dec. 18, 2018.

(51) Int. Cl.
   *G06K 9/00* (2006.01)
   *G06T 7/00* (2017.01)
   (Continued)

(52) U.S. Cl.
   CPC ........ *G06T 7/0004* (2013.01); *G01R 31/2653* (2013.01); *G06K 9/6256* (2013.01);
   (Continued)

(58) Field of Classification Search
   CPC .......... G01N 21/9501; G01N 21/8851; G01N 2021/8867; G01N 2021/8887;
   (Continued)

(56) References Cited

U.S. PATENT DOCUMENTS 9,702,827 B1 * 7/2017 Brauer ............... G01N 21/8851
9,714,905 B1 * 7/2017 Plihal ...................... H01L 22/12
(Continued)

OTHER PUBLICATIONS

PCT/US2019/066102, International Search Report, dated Apr. 13, 2020.
(Continued)

*Primary Examiner* — Li Liu
(74) *Attorney, Agent, or Firm* — Huse IP Law; Charles C. Huse

(57) ABSTRACT

One or more semiconductor wafers or portions thereof are scanned using a primary optical mode, to identify defects. A plurality of the identified defects, including defects of a first class and defects of a second class, are selected and reviewed using an electron microscope. Based on this review, respective defects of the plurality are classified as defects of either the first class or the second class. The plurality of the identified defects is imaged using a plurality of secondary optical modes. One or more of the secondary optical modes are selected for use in conjunction with the primary optical mode, based on results of the scanning using the primary optical mode and the imaging using the plurality of secondary optical modes. Production semiconductor wafers are scanned for defects using the primary optical mode and the one or more selected secondary optical modes.

14 Claims, 3 Drawing Sheets

(51) Int. Cl.
*G06K 9/62* (2006.01)
*G01R 31/265* (2006.01)

(52) U.S. Cl.
CPC .. *G06K 9/6282* (2013.01); *G06T 2207/10061* (2013.01); *G06T 2207/20081* (2013.01); *G06T 2207/20084* (2013.01); *G06T 2207/30148* (2013.01)

(58) Field of Classification Search
CPC .... G01N 21/95607; G06T 2207/30148; G06T 2207/20081; G06T 2207/20084; G06T 2207/10061; G06T 7/001; G06T 7/0004; G06K 9/6256; G06K 2209/19; G06K 9/6267; G03F 7/7065
See application file for complete search history.

(56) References Cited

U.S. PATENT DOCUMENTS

| | | | | |
|---|---|---|---|---|
| 10,115,040 | B2 | 10/2018 | Brauer | |
| 10,607,119 | B2* | 3/2020 | He | G06K 9/6267 |
| 2008/0279444 | A1* | 11/2008 | Fischer | G01N 21/9501 |
| | | | | 382/145 |
| 2010/0188657 | A1* | 7/2010 | Chen | G01N 21/9501 |
| | | | | 356/237.5 |
| 2011/0320149 | A1 | 12/2011 | Lee et al. | |
| 2013/0077092 | A1 | 3/2013 | Sasazawa et al. | |
| 2015/0254394 | A1 | 9/2015 | Hu et al. | |
| 2015/0254832 | A1 | 9/2015 | Plihal | |
| 2016/0123898 | A1* | 5/2016 | Chen | H01J 37/28 |
| | | | | 356/237.5 |
| 2017/0018403 | A1* | 1/2017 | Koronel | H01J 37/265 |
| 2017/0200260 | A1 | 7/2017 | Bhaskar et al. | |
| 2018/0075594 | A1* | 3/2018 | Brauer | G01N 21/9501 |
| 2020/0089130 | A1* | 3/2020 | Chao | G03F 7/70433 |

OTHER PUBLICATIONS

PCT/US2019/066102, Written Opinion of the International Searching Authority, dated Apr. 13, 2020.

Nagendra Kumar & Andreas G. Andreou, "On Generalizations of Linear Discriminant Analysis," Tech. Report JHU/ECE-96-07, Apr. 8, 1996 (Johns Hopkins University), pp. 1-30.

Quanquan Gu et al., "Generalized Fisher Score for Feature Selection," arXiv:1202.3725 (Feb. 14, 2012).

R.A. Fisher, "The Statistical Utilization of Multiple Measurements," Annals of Human Genetics, vol. 8, No. 4, pp. 376-386, 1938.

Vaibhav Gaind et al., U.S. Appl. No. 16/272,528, filed Feb. 11, 2019.

* cited by examiner

OPTICAL-MODE SELECTION FOR MULTI-MODE SEMICONDUCTOR INSPECTION

RELATED APPLICATION

This application claims priority to U.S. Provisional Patent Application No. 62/781,593, filed Dec. 18, 2018, titled "Optical Mode Selection for Multi-Mode Inspections," which is hereby incorporated by reference in its entirety for all purposes.

TECHNICAL FIELD

This disclosure relates to semiconductor inspection, and more specifically to selecting optical modes to be used for semiconductor defect inspection.

BACKGROUND

Modern optical semiconductor-inspection tools use wavelengths that are significantly longer than the dimensions of a typical defect, often by an order of magnitude or more. As such, inspection tools cannot resolve the defects and thus cannot provide images showing the defects; instead, the inspection tools merely provide an indication that a defect has been detected. Furthermore, many of the detected defects are so-called nuisance defects that do not impede device functionality, as opposed to defects of interest (DOI), which impede device functionality. Unlike DOI, nuisance defects are not of interest to process-integration and yield-improvement engineers. And nuisance defects may outnumber defects of interest. The high volume of nuisance defects makes it impractical to perform subsequent failure analysis (e.g., visualization using a scanning electron microscope (SEM)) on all identified defects. The high volume of nuisance defects also makes it impossible to determine whether a wafer should be scrapped or reworked due to a high number of DOI.

Existing techniques for distinguishing DOI from nuisance defects are limited in their effectiveness. For example, a single best optical mode for distinguishing the two types of defects may be identified and used for inspection. This approach ignores information that other optical modes can provide. It thus may be desirable to inspect semiconductor wafers using both a primary optical mode and one or more secondary optical modes. Determining which secondary optical modes are the most suitable for distinguishing the two types of defects is challenging, however, given the large number of possible secondary modes.

SUMMARY

Accordingly, there is a need for improved methods and systems of classifying semiconductor defects. Such methods and systems may involve selecting one or more secondary optical modes for use in conjunction with a primary optical mode to scan for defects.

In some embodiments, a semiconductor-inspection method includes scanning one or more semiconductor wafers or portions thereof using a primary optical mode, to identify defects. A plurality of the identified defects, including defects of a first class and defects of a second class, are selected. The selected defects are reviewed using an electron microscope. Based on this review, respective defects of the plurality are classified as defects of either the first class or the second class. The plurality of the identified defects is imaged using a plurality of secondary optical modes. One or more of the secondary optical modes are selected for use in conjunction with the primary optical mode, based on results of scanning the one or more semiconductor wafers or portions thereof using the primary optical mode and imaging the plurality of the identified defects using the plurality of secondary optical modes. Production semiconductor wafers are scanned using the primary optical mode and the one or more selected secondary optical modes, to identify defects.

In some embodiments, a non-transitory computer-readable storage medium stores one or more programs for execution by one or more processors of a semiconductor-inspection system that includes one or more semiconductor-inspection tools. The one or more programs include instructions for performing all or a portion of the above method. In some embodiments, a semiconductor-inspection system includes one or more semiconductor-inspection tools, one or more processors, and memory storing one or more programs for execution by the one or more processors. The one or more programs include instructions for performing all or a portion of the above method.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

A semiconductor wafer may be inspected for defects using multiple optical modes (e.g., a primary optical mode and one or more secondary optical modes). Each optical mode has a distinct combination of optical characteristics. In some embodiments, the optical characteristics include the range of wavelengths, polarization, focus, aperture (e.g., transmission distribution in the illumination aperture and transmission distribution in the collection aperture), and/or phase-shift distribution in the collection aperture. A first optical mode differs from a second optical mode in that the value of at least one of the optical characteristics is different.

For a given optical mode, defects are identified by scanning the semiconductor wafer to generate target images of respective die on the wafer. A reference image of the die is subtracted from the target image (or vice-versa) on a pixel-by-pixel basis, to produce a difference image that reveals defects. For example, if pixel values for a particular area in the difference image have an intensity that satisfies a threshold, then the area is identified as having a defect. The scanning may not detect some defects, because the defects are very small or do not cause a difference in reflectivity of the incoming light.

Figure 1:
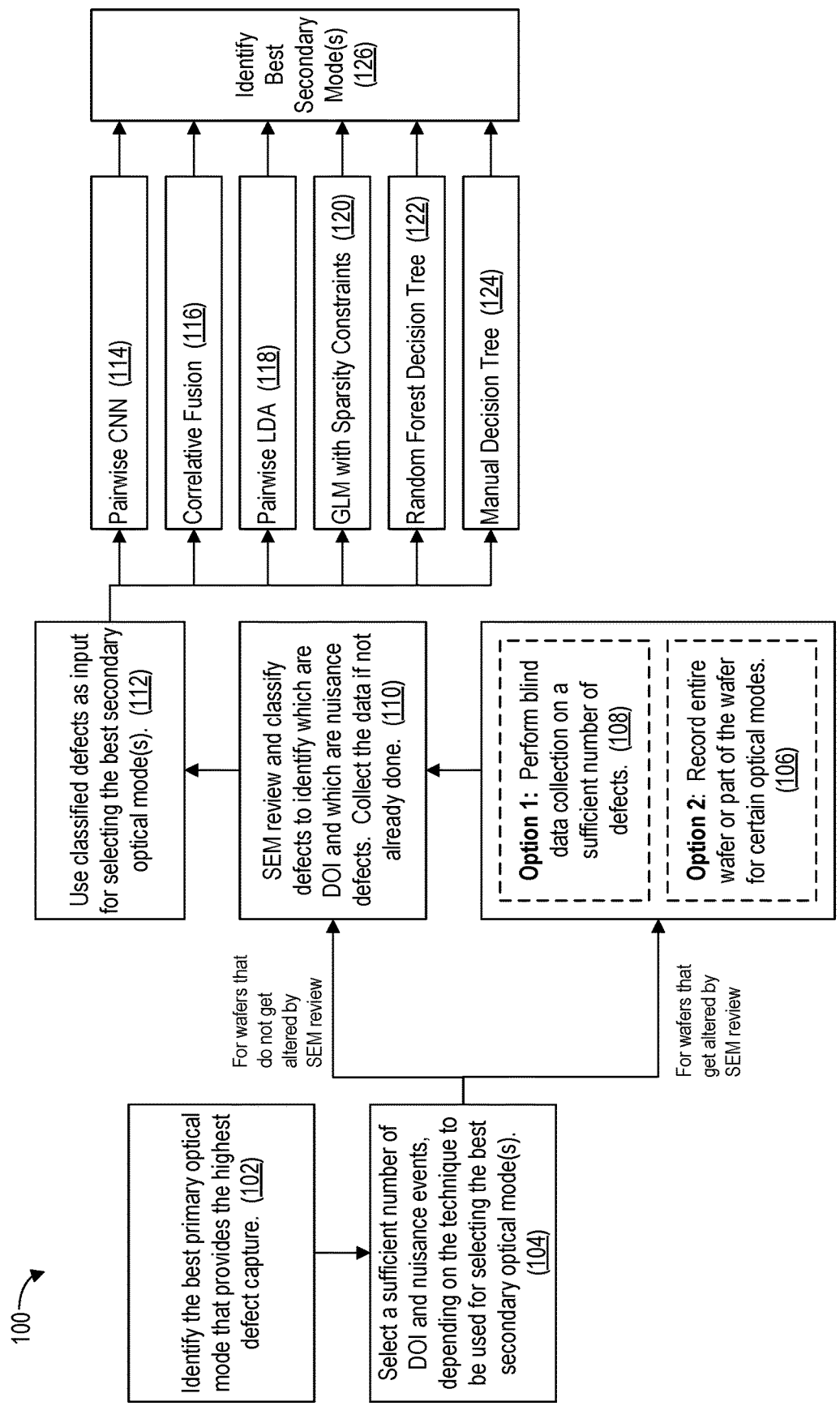
FIG. 1 shows a flowchart of a method of selecting one or more secondary optical modes for use in conjunction with a primary optical mode to distinguish defects of interest from nuisance defects, in accordance with some embodiments.
Figure 3:
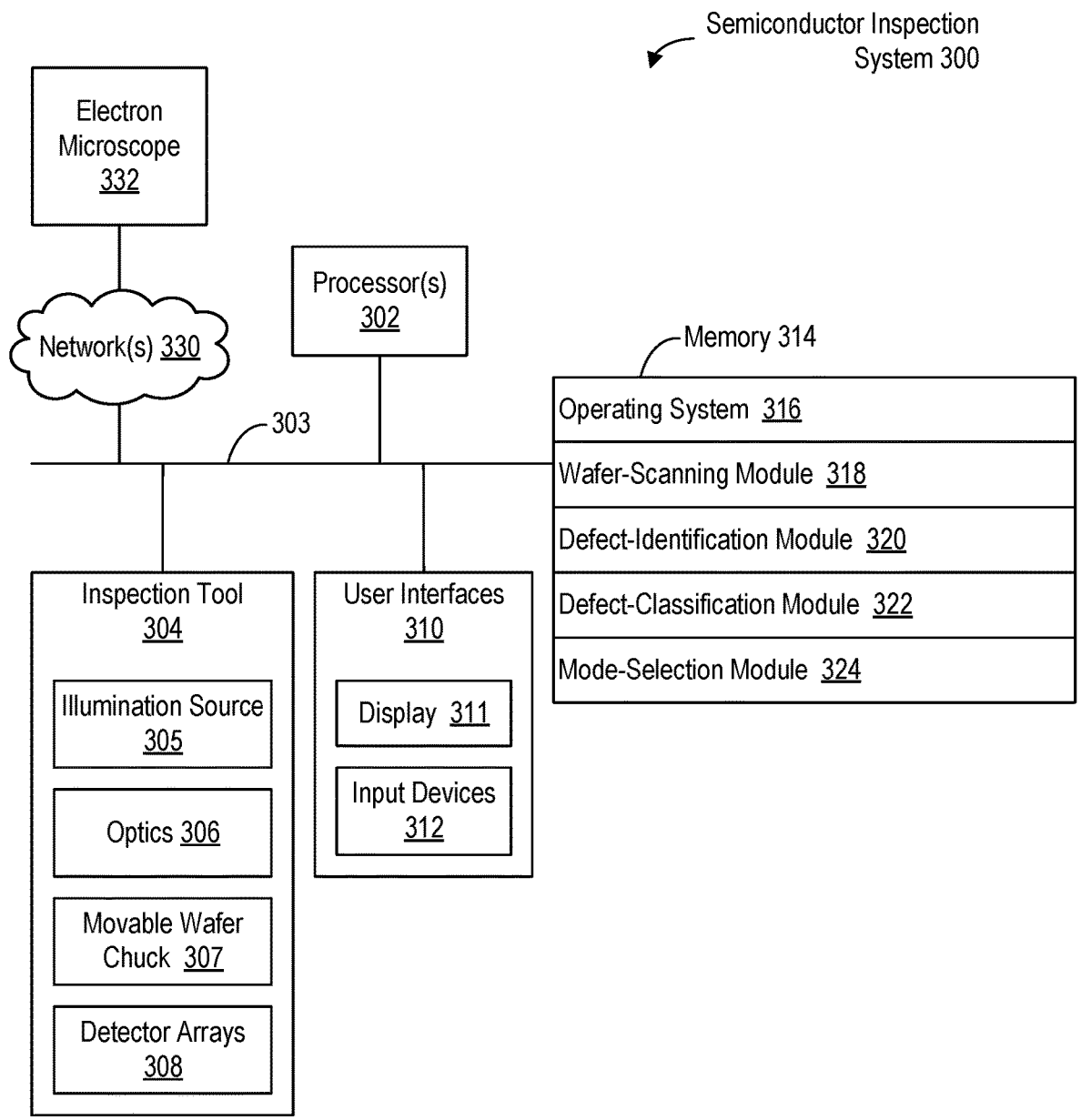
FIG. 3 is a block diagram of a semiconductor-inspection system in accordance with some embodiments.

FIG. 1 shows a flowchart of a method of selecting one or more secondary optical modes for use in conjunction with a primary optical mode to distinguish defects of interest (DOIs) from nuisance defects, in accordance with some embodiments. The method 100 may be performed using one or more semiconductor-inspection systems 300 (FIG. 3). Steps in the method 100 may be combined or broken out.

In the method 100, a best primary optical mode is identified (102). In some embodiments, various optical modes are used to inspect one or more semiconductor wafers, or portions of one or more semiconductor wafers, for defects. The best primary optical mode may be the optical mode that provides the highest overall defect capture rate (i.e., that identifies the largest overall number of defects) or the highest DOI capture rate (i.e., that identifies the largest number of DOI).

A sufficient number of DOI and nuisance events (i.e., defects identified using the primary mode) are selected (104) to allow for subsequent evaluation of secondary optical modes. The number of events selected may depend on the technique to be used to evaluate secondary optical modes, and may be chosen to allow an adequate signal of the separation between DOI and nuisance defects for the technique. In some embodiments, all defects identified on one or more semiconductor wafers, or portions thereof, using the primary optical modes are selected. Alternatively, only a subset of the identified defects is selected.

The selected defects are reviewed (110) using a SEM and classified: the SEM review identifies which of the selected defects are DOI and which are nuisance defects. The selected defects may then be inspected using a plurality of secondary optical modes and the defect data from this inspection may be collected and recorded (110). Alternatively, defect inspection using the plurality of secondary optical modes is performed before SEM review, because SEM review may alter wafers. Such alteration, referred to as SEM burning, results from carbon deposition on some wafers during SEM review and damages the wafers. This damage interferes with any subsequent defect inspection. One option for dealing with SEM burning is to perform blind data collection (108) using the plurality of secondary optical modes on a sufficient number of defects before SEM review. This data collection is considered to be blind because the defects have not yet been classified. Another option is to record an entire wafer or portion thereof (106) pixel by pixel using the plurality of secondary optical modes, then perform SEM review, and extract the relevant optical image data using the recorded data set.

Once the selected defects have been classified, they are provided as input (112) to a technique for selecting one or more secondary optical modes as the best secondary optical mode(s). Examples of such techniques include pairwise convolutional neural networks (CNNs) 114, correlative fusion 116, pairwise linear discriminant analysis (LDA) 118, a generalized linear model (GLM) with sparsity constraints 120, random forest decision trees 122, and manual decision trees 124. Based on the technique results, one or more best secondary optical modes are identified (126).

Pairwise CNNs 114 may be used as described in U.S. Pat. No. 10,115,040, which is incorporated by reference in its entirety. A respective CNN is trained for each combination of the primary optical mode and one or more secondary optical modes. The CNN that provides the best separation between DOI and nuisance (e.g., that has the highest signal-to-noise ratio, the highest DOI capture rate, or the lowest nuisance rate) is identified and the corresponding one or more secondary optical modes for that CNN are identified as the best secondary optical mode(s). For example, the DOI capture rates (also known as true positive rate) for the CNNs are compared at a given nuisance rate, the CNN with the highest DOI capture rate at the given nuisance rate is identified, and the one or more secondary optical modes associated with that CNN are chosen as the best secondary optical mode(s).

In some embodiments, image data (e.g., difference image data corresponding to the classified defects of step 112) used to train the CNNs are annotated with defect locations and/or augmented with modified image data. The modified image data may be produced, for example, by modifying the reference image (or patches thereof) and generating a difference image (or patches thereof) using the modified reference image. In some embodiments, design clips and/or a mask image is used to generate the image data (e.g., to form the reference image or patches thereof).

For correlative fusion 116, which is also referred to as signal correlation, signal values (e.g., pixel values in the difference image) for identified defects are analyzed for respective combinations of the primary optical mode and one or more secondary optical modes. A defect may be labeled as a DOI if, for the defect, signal-value correlation that satisfies a threshold exists between the primary optical mode and the one or more secondary optical modes (e.g., if the inspection results for the primary optical mode and also for the one or more secondary optical modes detect a defect at the relevant location). For example, a metric equal or corresponding to the difference between the defect signal intensity and the mean pixel intensity, divided by the standard deviation of the pixel intensity is calculated. If, for a given combination, correlation exists between this metric for the primary optical mode and the one or more secondary optical modes, then the corresponding defect is labeled as a DOI; if not, the corresponding defect is labeled as a nuisance defect. The results of this analysis are compared to the results of the SEM review. The one or more secondary optical modes that, when combined with the primary optical mode, provide the best separation between DOIs and nuisance defects are identified as the best secondary optical mode(s).

Linear discriminant analysis 118 may be performed as described below and in U.S. patent application Ser. No. 16/272,528, which is incorporated by reference in its entirety.

A GLM with sparsity constraints in feature space 120 may be trained as a defect classifier. The GLM defect classifier is trained to classify pixel patches (i.e., defined pixel groupings within difference images) by imposing L1 and L2 norm constraints with an elastic net. The constraints are tightened until the GLM defect classifier only chooses pixels from two optical modes (i.e., the primary optical mode and a secondary optical mode), which compose the optimal set of modes. The training of the GLM defect classifier allows an operating point to be chosen anywhere on the receiver operating characteristic (ROC) curve, which specifies the DOI capture rate (i.e., detection rate or true positive rate) as a function of the nuisance rate (e.g., the number of predicted nuisance events divided by the total number of predicted DOI and nuisance events). Users thus may trade off the DOI capture rate against the nuisance rate.

An elastic net can include a combination of Lasso (L1 regularization penalty) and Ridge (L2 regularization penalty). In some embodiments, the elastic net has the form:

$$\operatorname{argmin}_\beta \|y - X\beta\|^2 + \alpha\|\beta\|^2 + (1-\alpha)\|\beta\| \quad (1)$$

where y indexes the defect classes and is either 0 (e.g., for DOI, or alternatively for nuisance defects) or 1 (e.g., for nuisance defects, or alternatively for DOI), X is a signal attribute, $\beta$ is a data-fitting parameter, and $\alpha$ has a value between 0 and 1. The second term of expression 1 helps to average highly correlated features, while the third term of expression 1 encourages a sparse solution of these averaged features.

In other embodiments, the regularization term of the elastic net has the form:

$$\Sigma_{j=1}^{p}(\alpha|\beta_j| + (1-\alpha)\beta_j^2) \quad (2)$$

where p is the number of different data-fitting parameters, j indexes the data-fitting parameters, $\beta_j$ is a particular data-fitting parameter, and $\alpha$ has a value between 0 and 1.

For random forest decision trees 122, a respective random forest (i.e., a respective plurality of random forest decision trees) is trained for each combination of the primary optical mode and one or more secondary optical modes. Random forest decision trees are decorrelated by randomly selecting a new subset of predictors at each internal decision node in every single tree. The input data which is used for training/learning each decision tree is a bootstrap sample of the training data set with the goal to reduce variance (overfitting) when the learned model is applied to the test data set to predict the classes of the defects. The decision trees of the random forest include classifiers for filtering out nuisance defects. These classifiers may be referred to as sensitivity-tuner nuisance-event filter (STNEF) classifiers. Using the respective random forests, DOI capture rates are compared for a given nuisance rate for the various combinations of primary and secondary optical modes. The combination of the primary/secondary mode(s) with the respective random forest model that provides the best DOI capture rate at a given nuisance rate is identified.

For manual decision trees 124, a respective decision tree is created for each combination of the primary optical mode and one or more secondary optical modes. The decision trees include user-specified STNEF classifiers that are determined based on defect-inspection results for the classified defects. The decision tree that provides the best DOI capture rate is identified and the corresponding one or more secondary optical modes for that decision tree are identified as the best secondary optical mode(s).

Figure 2:
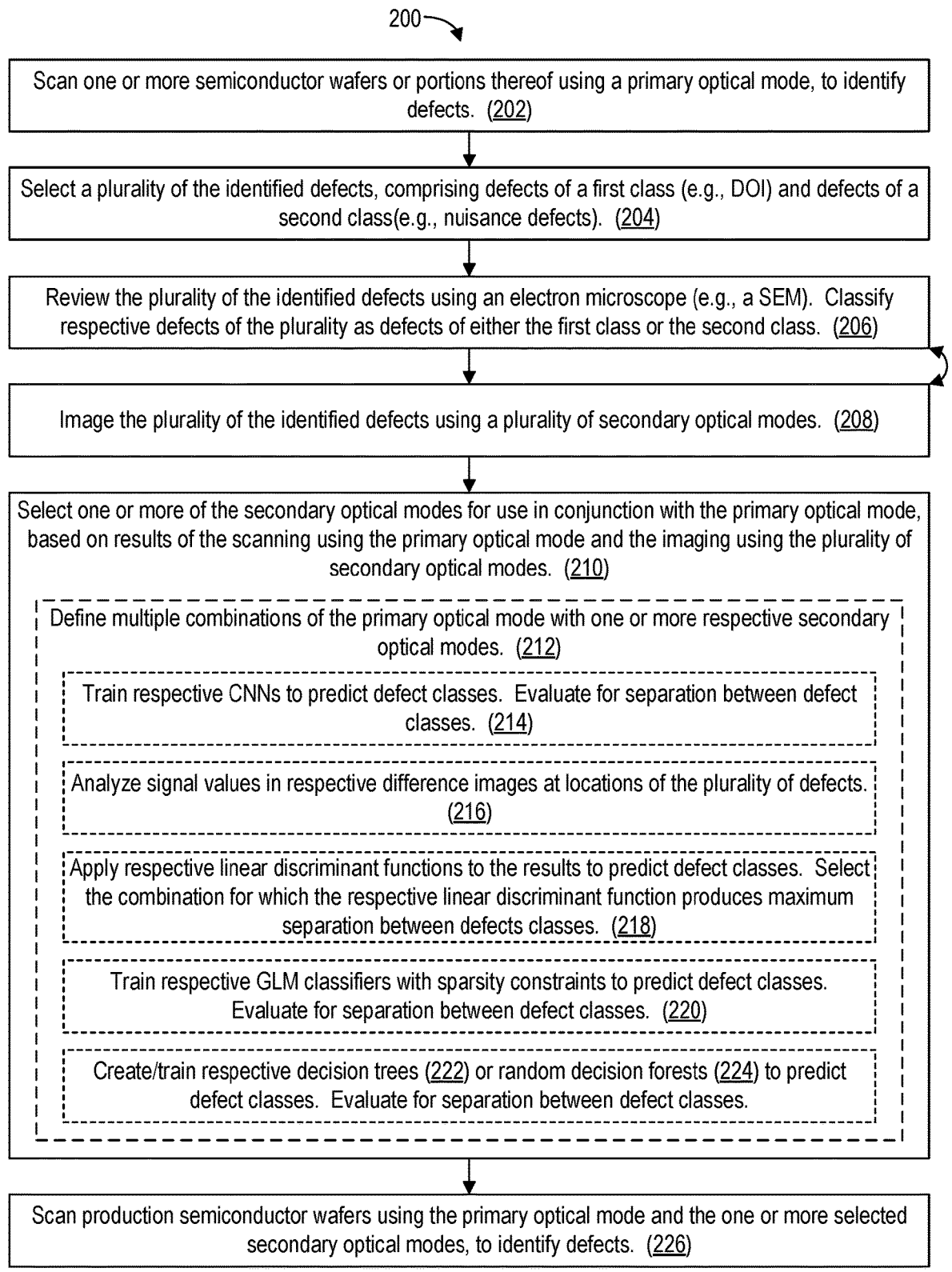
FIG. 2 shows a flowchart of a semiconductor-inspection method in which one or more secondary optical modes are selected for use in conjunction with a primary optical mode to classify defects, in accordance with some embodiments.

FIG. 2 shows a flowchart of a semiconductor-inspection method 200 in which one or more secondary optical modes are selected for use in conjunction with a primary optical mode to classify defects, in accordance with some embodiments. The method 200, like the method 100 (FIG. 1), may be performed using one or more semiconductor-inspection systems 300 (FIG. 3). Steps in the method 200 may be combined or broken out. The order in which steps are performed may be varied for steps that are not order-dependent.

In the method 200, one or more semiconductor wafers or portions thereof are scanned (202) using a primary optical mode (e.g., as identified in step 102 of the method 100, FIG. 1), to identify defects. The scanning includes imaging the one or more semiconductor wafers or portions thereof and identifying defects accordingly, using the resulting image data. The scanning may be performed using the inspection tool 304 (FIG. 3).

A plurality of the identified defects is selected (204) (e.g., as in step 104, FIG. 1). The selected plurality of defects includes defects of a first class and defects of a second class. In some embodiments, the first class of defects are defects of interest (DOI) that impede semiconductor-die functionality and the second class of defects are nuisance defects that do not impede semiconductor-die functionality.

The plurality of the identified defects is reviewed (206) using an electron microscope (e.g., a SEM). This review may be performed as described for step 110 (FIG. 1). Based on the review, respective defects are classified as defects of either the first class (e.g., DOI) or the second class (e.g., nuisance defects).

The plurality of the identified defects is imaged (208) using a plurality of secondary optical modes. This scanning may be performed using the same inspection tool 304 (FIG. 3) as for step 202 or a different inspection tool 304. In some embodiments, scanning (208) the one or more semiconductor wafers or portions thereof using each of the plurality of secondary optical modes is performed before the reviewing and the classifying (206), such that the order of steps 206 and 208 is reversed (e.g., in accordance with step 106 or 108, FIG. 1). The imaging may be limited to the specific sites (i.e., pixel locations) for the plurality of identified defects. Alternatively, the entire one or more semiconductor wafers or portions thereof may be imaged and the resulting image data recorded, and image data for the specific sites collected later, for example after the reviewing (e.g., SEM review) has been performed in the event that step 208 precedes step 206.

One or more of the secondary optical modes are selected (210) for use in conjunction with the primary optical mode, based on results of the scanning using the primary optical mode in step 202 and the imaging using the plurality of secondary optical modes in step 208. This selection may correspond to step 126 of the method 100 (FIG. 1).

In some embodiments, multiple combinations of the primary optical mode with one or more respective secondary optical modes are defined (212). For each combination of the multiple combinations, a respective convolutional neural network (CNN) may be trained (214) to predict the classes of the plurality of identified defects (e.g., in accordance with step 114, FIG. 1), thereby producing a plurality of CNNs. The plurality of CNNs is evaluated for separation of defects in the first class from defects in the second class. A CNN is chosen based on this evaluation and its secondary optical mode(s) selected. For example, the one or more selected secondary optical modes correspond to a respective CNN that produces maximum separation between defects in the first class and defects in the second class out of the plurality of CNNs. The plurality of CNNs may be trained using image data that is annotated with defect locations and/or augmented with modified image data.

Alternatively, or in addition, for each of the one or more respective secondary optical modes of a respective combination, signal values in a respective difference image are analyzed (216) at locations of the plurality of defects (e.g., in accordance with step 116, FIG. 1). One or more secondary optical modes are selected based on this analysis. For example, the one or more selected secondary optical modes produce maximum separation between defects of the first class and defects of the second class out of all of the one or more respective secondary optical modes of the multiple combinations, as determined by analyzing the signal values.

Alternatively, or in addition, for each combination of the multiple combinations, a respective linear discriminant function is applied (218) to the results to predict the classes of the plurality of identified defects (e.g., in accordance with step 118, FIG. 1). The combination for which the respective linear discriminant function produces maximum separation between defects in the first class and defects in the second class out of the multiple combinations is identified, and its secondary optical mode(s) selected.

Alternatively, or in addition, a GLM classifier with sparsity constraints in feature space is trained (220) to predict the classes of the plurality of identified defects (e.g., in accordance with step 120, FIG. 1). One or more of the secondary optical modes are identified and selected based on defect-classification results from the GLM classifier.

Alternatively, or in addition, for each combination of the multiple combinations, a respective decision tree is created (222) to predict the classes of the plurality of identified defects (e.g., in accordance with step 122, FIG. 1), thereby producing a plurality of decision trees. The plurality of decision trees is evaluated for separation of defects in the first class from defects in the second class. A decision tree is chosen based on this evaluation and its secondary optical mode(s) selected. For example, the one or more selected secondary optical modes correspond to a decision tree that produces maximum separation between defects in the first class and defects in the second class out of the plurality of decision trees.

Alternatively, or in addition, for each combination of the multiple combinations, a respective plurality of random forest decision trees is trained (224) to predict the classes of the plurality of identified defects (e.g., in accordance with step 124, FIG. 1), thereby producing pluralities of random forest decision trees (i.e., a plurality of random forests, with each random forest being trained for a respective combination). The pluralities of random forest decision trees are evaluated for separation of defects in the first class from defects in the second class. A random forest is chosen based on this evaluation and its secondary optical mode(s) selected. For example, the one or more selected secondary optical modes correspond to a random forest that produces maximum separation between defects in the first class and defects in the second class out of the pluralities of random forest decision trees (i.e., the plurality of random forests).

Production semiconductor wafers are scanned (226) using the primary optical mode and the one or more selected secondary optical modes, to identify defects. This scanning may be performed using one or more inspection tools 304 (e.g., the same inspection tool 304 as for steps 202 and/or 208, and/or different inspection tools 304).

In some embodiments, a report is generated specifying results of step 226. For example, the report may list all identified defects (e.g., with their coordinates) for a die, wafer, or portion thereof and specify the class of each defect. Alternatively, the report may list DOIs (e.g., with their coordinates) and omit nuisance defects. The report may be graphical; for example, the report may show a wafer map or die map with indications of the locations of defects by class, or with indications of the locations of defects in a particular class, such as DOIs. The report may be displayed (e.g., on display 311, FIG. 3) and/or transmitted to a client device for display.

In some embodiments, a decision whether to scrap, rework, or continue to process a wafer is made based at least in part on DOIs identified based on step 226.

FIG. 3 is a block diagram of a semiconductor-inspection system 300 in accordance with some embodiments. The semiconductor-inspection system 300 includes a semiconductor-inspection tool 304 and associated computer circuitry, including one or more processors 302 (e.g., CPUs), user interfaces 310, memory 314, and one or more communication buses 303 interconnecting these components. The semiconductor-inspection system 300 may also include one or more network interfaces (wired and/or wireless, not shown) for communicating with (e.g., retrieving recipes from and/or transmitting data to) remote computer systems. The semiconductor-inspection system 300 may be communicatively coupled with an electron microscope 332 (e.g., a SEM) through one or more networks 330.

The inspection tool 304 includes an illumination source 305, illumination and collection optics 306, a movable wafer chuck 307 onto which semiconductor wafers are loaded for inspection, and one or more detector arrays 308.

The user interfaces 310 may include a display 311 and one or more input devices 312 (e.g., a keyboard, mouse, touch-sensitive surface of the display 311, etc.). The display 311 may display results of optical-mode selection, defect identification, and defect classification.

Memory 314 includes volatile and/or non-volatile memory. Memory 314 (e.g., the non-volatile memory within memory 314) includes a non-transitory computer-readable storage medium. Memory 314 optionally includes one or more storage devices remotely located from the processors 302 and/or a non-transitory computer-readable storage medium that is removably inserted into the server system 300. In some embodiments, memory 314 (e.g., the non-transitory computer-readable storage medium of memory 314) stores the following modules and data, or a subset or superset thereof: an operating system 316 that includes procedures for handling various basic system services and for performing hardware-dependent tasks, a wafer-scanning module 318, a defect-identification module 320, a defect-classification module 322, and a mode-selection module 324.

The memory 314 (e.g., the non-transitory computer-readable storage medium of the memory 314) thus includes instructions for performing all or a portion of the method 100 (FIG. 1) and/or the method 200 (FIG. 2). Each of the modules stored in the memory 314 corresponds to a set of instructions for performing one or more functions described herein. Separate modules need not be implemented as separate software programs. The modules and various subsets of the modules may be combined or otherwise re-arranged. In some embodiments, the memory 314 stores a subset or superset of the modules and/or data structures identified above.

FIG. 3 is intended more as a functional description of the various features that may be present in a semiconductor-inspection system than as a structural schematic. For example, the arrangement of the components of the inspection tool 304 may vary (e.g., in manners known in the art). Items shown separately could be combined and some items could be separated. Furthermore, the functionality of the semiconductor-inspection system 300 may be split between multiple devices. For example, a portion of the modules stored in the memory 314 may alternatively be stored in one or more computer systems communicatively coupled with the semiconductor-inspection system 300 through one or more networks.

Attention is now directed to linear discriminant analysis (i.e., the use of a linear discriminant function) for defect classification, as described in U.S. Pat. No. 10,115,040. Defects are identified by scanning one or more semiconductor wafers, or portions thereof, using multiple optical modes (e.g., a primary optical mode and one or more secondary optical modes). Respective defects correspond to respective pixel sets in the images generated by the scanning. (Each pixel set is the set affected by a corresponding defect.) The defect-identification results include multi-dimensional data based on pixel intensity (e.g., pixel-intensity data or data for an attribute derived from the pixel intensity) for the respective pixel sets, wherein each dimension of the multi-dimensional data corresponds to a distinct mode of the multiple optical modes. For example, the results include a vector $\vec{x}$ for each defect, where each entry $x_k$ of the vector $\vec{x}$ is a value based on pixel intensity (e.g., the intensity or an attribute value derived from the intensity) for a respective optical mode (i.e., for the kth optical mode). Each entry of the vector $\vec{x}$ thus corresponds to a result for a distinct optical mode for a particular defect.

For the respective pixel sets, a linear discriminant function is applied to the results to transform the multi-dimensional data into respective scores. The linear discriminant function specifies a direction that separates (e.g., maximally separates) the respective defects into the distinct classes (e.g., first and second classes, such as DOIs and nuisance defects). For example, for a respective pixel set, applying the discriminant function includes determining a projection of a vector containing the multi-dimensional data onto an axis corresponding to (e.g., perpendicular to) the direction specified by the linear discriminant function.

For example, to apply the linear discriminant function, means are calculated for each class of defects. If there are two classes indexed class 0 and class 1 (e.g., nuisance defects and DOIs, respectively), then means $\mu_0$ and $\mu_1$ are calculated:

$$\vec{\mu}_0 = \frac{1}{N_0} \sum \vec{x}_0^i \quad (3)$$

$$\vec{\mu}_1 = \frac{1}{N_1} \sum \vec{x}_1^i \quad (4)$$

where $\vec{x}_j^i$ is the ith defect in class j, $N_0$ is the number of defects in class 0 (e.g., the number of nuisance defects), and $N_1$ is the number of defects in class 1 (e.g., the number of defects of interest). Each summation is thus over all the defects in the respective class. Covariances are then calculated using the means. For class 0 and class 1, respective covariances $S_0$ and $S_1$ are calculated:

$$S_0 = \frac{1}{N_0 - 1} \sum (\vec{x}_0^i - \vec{\mu}_0)(\vec{x}_0^i - \vec{\mu}_0)^T \quad (5)$$

$$S_1 = \frac{1}{N_1 - 1} \sum (\vec{x}_1^i - \vec{\mu}_1)(\vec{x}_1^i - \vec{\mu}_1)^T \quad (6)$$

where i indexes the defects of the respective classes. A pooled covariance $S_p$ for the defect classes is then calculated:

$$S_p = \frac{(N_0 - 1)}{(N - 2)} S_0 + \frac{(N_1 - 1)}{(N - 2)} S_1 \quad (7)$$

where $N = N_0 + N_1$.

The pooled covariance $S_p$ is used in a transformation that transforms $\vec{x}$ into a score L with a dimensionality equal to the number of classes. For the example of class 0 and class 1, $$\vec{L} = [L_0, L_1]^T. \quad (8)$$

The transformation is achieved by applying the linear discriminate function, where:

$$\vec{L} = T(\vec{x}) = \hat{W}^T \vec{x} + \vec{c}, \text{ where} \quad (9)$$

$$\hat{W} = [\vec{W}_0, \vec{W}_1], \quad (10)$$

$$\vec{W}_i^T \stackrel{def}{=} \vec{\mu}_i^T S_p^{-1}, \quad (11)$$

$$\vec{c} = [c_0, c_1]^T, \text{ and} \quad (12)$$

$$c_i \stackrel{def}{=} -\frac{1}{2} \vec{\mu}_i^T S_p^{-1} \mu_i + \log(pr_i) \quad (13)$$

where i indexes the classes. In equation 13, $pr_i$ is a prior probability distribution that may be assumed to be constant:

$$pr_i = N_i / N. \quad (14)$$

Equation 9 effectively specifies a direction that maximally separates the identified defects into class 0 and class 1. Equation 9 projects the vector $\vec{x}$, which contains the multi-dimensional data, onto an axis perpendicular to this direction.

In some embodiments, the discriminant function is determined based on a training set of defects (e.g., the selected defects of steps 104 and/or 204, FIGS. 1-2) that includes defects from all of the distinct classes. A training set of defects is initially identified by scanning one or more die of the type of interest and then performing failure analysis to classify at least some of the identified defects (e.g., SEM review and/or using other appropriate failure-analysis techniques). For example, in equation 9, $\hat{W}$ and $\vec{c}$ may be determined based on a training set.

Based at least in part on the respective scores, the respective defects are divided into distinct classes. In some embodiments, the respective scores are converted to probabilities that the respective defects belong to particular classes of the distinct classes. The respective defects are classified based on the probabilities. For example, the respective scores are converted to probabilities that the respective defects are defects of interest or nuisance defects, and the respective defects are classified based on the probabilities. To convert the scores obtained in equation 9 to probabilities, the softmax function may be applied to obtain:

$$P_i(\vec{x}) = \frac{\exp[L_i(\vec{x})]}{\sum_j \exp[L_j(\vec{x})]} \quad (15)$$

where i again indexes the classes, as does j. The summation in the denominator is thus over the plurality of classes (e.g., over class 0 and class 1), while the value in the numerator is for a specific class (e.g., class 0 or class 1).

In some embodiments, optical modes (e.g., one or more secondary optical modes) may be selected based on Fisher's score (or another score that indicates the efficacy of a set of optical modes in classifying defects). Scanning is performed using all optical modes in a group of available optical modes. If the group of available optical modes has M optical modes, then Fisher's score for a subset of the group of optical modes is defined as:

$$F(X) = Tr[S_b(X)S_p^{-1}(X)], \text{ where} \qquad (16)$$

$$X = \{\vec{x}, \vec{x} \in R^{M'}, \text{ where } M' \leq M\}, \qquad (17)$$

$$S_b = \sum_i (\mu_i - \overline{\mu})(\mu_i - \overline{\mu})^T, \qquad (18)$$

$$S_p(X) = \sum_i \frac{N_i - 1}{N - 2} S_i(X), \qquad (19)$$

$$S_i(X) = \frac{1}{N_i - 1} \sum_{j \text{ in Class } i} (x_i^j - \mu_i)(x_i^j - u_i)^T, \text{ and} \qquad (20)$$

$$\overline{\mu} = \frac{1}{N} \sum_i \mu_i N_i. \qquad (21)$$

The summations in equations 18, 19, and 21 are over all classes i (e.g., over classes 0 and 1). The summation in equation 20 is over defects in a particular class i. Fisher's score may be calculated for multiple subsets of the group, and the subset with the highest score is selected as the plurality of optical modes. For example, Fisher's score may be calculated for all subsets with two or more optical modes (e.g., the primary optical mode and a distinct secondary optical mode or set of secondary optical modes), for all subsets with exactly two optical modes, or for all subsets with a number of optical modes greater than or equal to two and less than or equal to a specified number.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A semiconductor-inspection method, comprising:
    scanning one or more semiconductor wafers or portions thereof using a primary optical mode, to identify defects;
    selecting a plurality of the identified defects;
    reviewing the plurality of the identified defects using an electron microscope;
    based on the reviewing, classifying respective defects of the plurality as defects of either a first class or a second class;
    imaging the plurality of the identified defects using a plurality of secondary optical modes;
    selecting one or more of the secondary optical modes for use in conjunction with the primary optical mode, based on results of the scanning and the imaging for the classified defects, comprising:
        defining multiple combinations of the primary optical mode with one or more respective secondary optical modes of the plurality of secondary optical modes,
        for each combination of the multiple combinations, training a respective convolutional neural network (CNN) to predict classes of the plurality of identified defects, thereby producing a plurality of CNNs, and
        evaluating the plurality of CNNs for separation of defects in the first class from defects in the second class; and
    scanning production semiconductor wafers using the primary optical mode and the one or more selected secondary optical modes, to identify defects.

2. The method of claim 1, wherein:
    the first class is defects of interest that impede semiconductor-die functionality; and
    the second class is nuisance defects that do not impede semiconductor-die functionality.

3. The method of claim 1, wherein:
    selecting the one or more of the secondary optical modes comprises selecting a single secondary optical mode for use in conjunction with the primary optical mode; and
    scanning the production semiconductor wafers is performed using the primary optical mode and the single secondary optical mode.

4. The method of claim 1, wherein the electron microscope is a scanning electron microscope (SEM).

5. The method of claim 1, wherein imaging the plurality of the identified defects using the plurality of secondary optical modes is performed before the reviewing and the classifying.

6. The method of claim 1, wherein imaging the plurality of the identified defects using the plurality of secondary optical modes is performed after the reviewing and the classifying.

7. The method of claim 1, wherein the one or more selected secondary optical modes correspond to a respective CNN that produces maximum separation between defects in the first class and defects in the second class out of the plurality of CNNs.

8. The method of claim 1, wherein the plurality of CNNs is trained using image data annotated with defect locations.

9. The method of claim 1, wherein the plurality of CNNs is trained using image data augmented with modified image data.

10. A non-transitory computer-readable storage medium storing one or more programs for execution by one or more processors of a semiconductor-inspection system that includes one or more semiconductor-inspection tools, the one or more programs including instructions for:
    selecting a plurality of defects identified by scanning one or more semiconductor wafers or portions thereof using a primary optical mode;
    based on review of the plurality of the identified defects using an electron microscope, classifying respective defects of the plurality as defects of either a first class or a second class; and
    based on results of scanning the classified defects and of imaging the classified defects using a plurality of secondary optical modes, selecting one or more of the secondary optical modes for use in conjunction with the primary optical mode to scan production semiconductor wafers, comprising:
        defining multiple combinations of the primary optical mode with one or more respective secondary optical modes of the plurality of secondary optical modes,
        for each combination of the multiple combinations, training a respective convolutional neural network (CNN) to predict classes of the plurality of identified defects, thereby producing a plurality of CNNs, and evaluating the plurality of CNNs for separation of defects in the first class from defects in the second class.

11. A semiconductor-inspection system, comprising:
one or more semiconductor-inspection tools;
one or more processors; and
memory storing one or more programs for execution by the one or more processors, the one or more programs comprising instructions for:
scanning one or more semiconductor wafers or portions thereof using a primary optical mode, to identify defects;
selecting a plurality of the identified defects;
based on review of the plurality of the identified defects using an electron microscope, classifying respective defects of the plurality as defects of either a first class or a second class;
imaging the plurality of the identified defects using a plurality of secondary optical modes;
selecting one or more of the secondary optical modes for use in conjunction with the primary optical mode, based on results of the scanning and the imaging for the classified defects, comprising:
defining multiple combinations of the primary optical mode with one or more respective secondary optical modes of the plurality of secondary optical modes,
for each combination of the multiple combinations, training a respective convolutional neural network (CNN) to predict classes of the plurality of identified defects, thereby producing a plurality of CNNs, and
evaluating the plurality of CNNs for separation of defects in the first class from defects in the second class; and
scanning production semiconductor wafers using the primary optical mode and the one or more selected secondary optical modes, to identify defects.

12. The system of claim 11, wherein:
the first class is defects of interest that impede semiconductor-die functionality; and
the second class is nuisance defects that do not impede semiconductor-die functionality.

13. The system of claim 11, wherein the instructions for imaging the plurality of the identified defects using the plurality of secondary optical modes comprise instructions for performing the imaging before the classifying.

14. The system of claim 11, wherein the instructions for evaluating the plurality of CNNs comprise instructions for identifying a respective CNN that produces maximum separation between defects in the first class and defects in the second class out of the plurality of CNNs.

* * * * *